(12) United States Patent
Northrup et al.

(10) Patent No.: US 9,219,189 B2
(45) Date of Patent: Dec. 22, 2015

(54) GRADED ELECTRON BLOCKING LAYER

(75) Inventors: John E. Northrup, Palo Alto, CA (US);
Bowen Cheng, Atherton, CA (US);
Christopher L. Chua, San Jose, CA (US); Thomas Wunderer, Palo Alto, CA (US); Noble M. Johnson, Menlo Park, CA (US); Zhihong Yang, San Jose, CA (US); Suk Choi, San Jose, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 247 days.

(21) Appl. No.: 13/619,687

(22) Filed: Sep. 14, 2012

(65) Prior Publication Data

US 2015/0280056 A1 Oct. 1, 2015

(51) Int. Cl.
*H01L 33/00* (2010.01)
*H01L 33/06* (2010.01)
*H01L 33/14* (2010.01)
*H01L 33/16* (2010.01)

(52) U.S. Cl.
CPC ........ *H01L 33/0025* (2013.01); *H01L 33/0075* (2013.01); *H01L 33/06* (2013.01); *H01L 33/145* (2013.01); *H01L 33/16* (2013.01)

(58) Field of Classification Search
CPC .................................................. H01L 33/145
USPC .......... 257/13, 14, 94, 97, E33.049, E33.008, 257/101; 438/47
See application file for complete search history.

(56) References Cited

U.S. PATENT DOCUMENTS

| | | | |
|---|---|---|---|
| 6,128,535 A | 10/2000 | Maarse | |
| 6,515,313 B1 * | 2/2003 | Ibbetson et al. | 257/103 |
| 2007/0181869 A1 * | 8/2007 | Gaska et al. | 257/14 |
| 2008/0054248 A1 | 3/2008 | Chua et al. | |
| 2008/0191195 A1 | 8/2008 | Tanizawa et al. | |
| 2009/0309127 A1 | 12/2009 | Raring et al. | |
| 2010/0327293 A1 | 12/2010 | Hikita et al. | |
| 2011/0064103 A1 * | 3/2011 | Ohta et al. | 372/45.01 |
| 2011/0140083 A1 | 6/2011 | Driscoll et al. | |
| 2011/0168977 A1 | 7/2011 | Eichler et al. | |
| 2011/0216797 A1 | 9/2011 | Watanabe et al. | |
| 2012/0189030 A1 | 7/2012 | Miyoshi | |
| 2012/0217473 A1 * | 8/2012 | Shur et al. | 257/13 |
| 2013/0099141 A1 | 4/2013 | Chua | |

OTHER PUBLICATIONS

Allerman et al., "Growth and Characterization of Mg-Doped AlGaN-AlN Short-Period Superlattices for Deep-UV Optoelectronic Devices", Journal of Crystal Growth, 312, 2010, pp. 756-761.

(Continued)

*Primary Examiner* — Jamie C Niesz
(74) *Attorney, Agent, or Firm* — Hollingsworth Davis, LLC

(57) ABSTRACT

A light emitting device includes a p-side heterostructure, an n-side heterostructure, an active region disposed between the p-side heterostructure and the n-side heterostructure. An electron blocking layer (EBL) disposed between the p-side heterostructure and the active region comprises an aluminum containing group-III-nitride alloy. An aluminum composition of the EBL decreases as a function of distance along a [0001] direction from the active region towards the p-side heterostructure over a majority of the thickness of the EBL.

29 Claims, 11 Drawing Sheets

(56) References Cited

OTHER PUBLICATIONS

Nakamura et al., "InGaN/GaN/AlGaN-based Laser Diodes with Modulation-doped Strained-layer Superlattices Grown on an Epitaxially Laterally Overgrown GaN Substrate", Appl. Phys. Lett. 72(2), Jan. 12, 1998, pp. 211-213.

Romanov et al., "Strain-Induced Polarization in Wurtzite III-Nitride Semipolar Layers", J. Appl. Phys. 100, 2006, 023522-1-023522-10.

Schubert et al., "Enhancement of Deep Acceptor Activation in Semiconductors by Superlattice Doping", Appl. Phys. Lett. 69, 1996, pp. 3737-3739.

"Good Grades for Reducing Nitride LED Efficiency Droop", Semiconductor Today, Jan. 13, 2011, 2 pages.

"Grading Barriers for Improved Hole Transport", Semiconductor Today, Nov. 26, 2011, 2 pages.

Simon et al., "Polarization-Induced Hole Doping in Wide-Band-Gap Uniaxial Semiconductor Heterostructures", Science, vol. 327, Jan. 1, 2010, pp. 60-64.

Simon, "Polarization-Engineered III-V Nitride Heterotstructure Devices by Molecular Beam Epitaxy", Apr. 2009, 140 pages.

Waldron et al., "Improved Mobilities and Resistivities in Modulation-Doped P-Type AlGaN/GaN Superlattices", Applied Physics Letters, vol. 79, No. 17, Oct. 22, 2001, pp. 2737-2739.

Wang et al., "Hole Injection and Efficiency Droop Improvement in InGaN/GaN Light-Emitting Diodes by Band-Engineered Electron Blocking Layer", Applied Physics Letters 97, 2010, 261103-1-261103-3.

Wang et al., "Hole Transport Improvement in InGaN/GaN Light-Emitting Diodes by Graded-Composition Multiple Quantum Barriers", Applied Physics Letters 99, 2011, 171106-1-171106-3.

Zhang et al., "Effect of the Graded Electron Blocking Layer on the Emission Properties of GaN-Based Green Light-Emitting Diodes", Applied Physics Letters, vol. 100, 2012, 053504-1-053504-3.

Nov. 21, 2014, U.S. File History for U.S. Appl. No. 13/619,598.

Kawaguchi et al., "Influence of polarity on carrier transport in semipolar (20) and (201) multiple-quantum-well light-emitting diodes," Appl. Phys. Lett. 100, 231110 (2012), 5 pages.

May 29, 2015, File History for U.S. Appl. No. 13/619,598.

* cited by examiner

US 9,219,189 B2

GRADED ELECTRON BLOCKING LAYER

STATEMENT REGARDING FEDERALLY SPONSORED RESEARCH AND DEVELOPMENT

This invention was made with U.S. Government support through the Defense Advanced Research Projects Agency (DARPA) under Army Research Laboratory (ARL) Cooperative Agreement # W911NF-10-02-0102. The Government has certain rights in this invention.

SUMMARY

Various embodiments described herein involve a light emitting device, that includes a p-side heterostructure, an n-side heterostructure, and active region disposed between the p-side heterostructure and the n-side heterostructure and configured to emit light. The active region may comprise a III-nitride material with an electron blocking layer (EBL) disposed between the p-side heterostructure and the active region. The EBL comprises an aluminum containing group-III-nitride alloy, wherein an aluminum composition of the EBL decreases as a function of distance along a [0001] direction from the active region towards the p-side heterostructure over a majority of the thickness of the EBL.

Some embodiments involve a light emitting device that includes a p-side heterostructure, an n-side heterostructure, and an active region disposed between the p-side heterostructure and the n-side heterostructure, where that active region is configured to emit light. The light emitting device includes an electron blocking layer (EBL) disposed between the p-side heterostructure and the active region. The EBL comprises $Al_yGa_{1-y}N$, wherein y decreases as a function of distance along a [0001] direction from the active region towards the p-side heterostructure over a majority of the thickness of the EBL.

Various embodiments described herein involve a light emitting device that includes a p-side heterostructure, an n-side heterostructure, an active region disposed between the p-side heterostructure and the n-side heterostructure and configured to emit light, the active region comprising a III-nitride material and an electron blocking layer (EBL) disposed between the p-side heterostructure and the active region. The EBL includes an aluminum containing group III-nitride alloy. In some implementations, the EBL is grown on a surface identified by crystallographic indices (hk($\overline{h+k}$)m) with m>0 and an aluminum composition in the EBL decreases as a function of distance along a direction, $V_n$, normal to the (hk($\overline{h+k}$)m) surface over a majority of a thickness of the EBL. In some implementations, the EBL is grown on a surface identified by crystallographic indices (hk($\overline{h+k}$) m) with m<0 and the aluminum composition increases as a function of distance along a direction, Vn normal to the (hk($\overline{h+k}$)m) surface over a majority of a thickness of the EBL.

Some embodiments involve a light emitting device that includes a p-side heterostructure, an n-side heterostructure and an active region disposed between the p-side heterostructure and the n-side heterostructure and configured to emit light, the active region comprising a number of quantum wells separated by barriers, the barriers including a last barrier comprising $Al_zGa_{1-z}N$. An electron blocking layer (EBL) comprising $Al_yGa_{1-y}N$ is disposed between the p-side heterostructure and the active region.

In some implementations the EBL is grown on a surface identified by crystallographic indices (hk($\overline{h+k}$)m) with m>0, and y decreases as a function of distance along a direction, $V_n$, normal to the (hk($\overline{h+k}$)m) surface over a majority of a thickness of the EBL. The value of z proximate the EBL is greater than the value of z proximate the quantum well.

In some implementations, the EBL is grown on a surface identified by crystallographic indices (hk($\overline{h+k}$)m) with m<0, and y increases as a function of distance along a direction, Vn normal to the (hk($\overline{h+k}$)m) surface over a majority of a thickness of the EBL. The value of z proximate the EBL is greater than the value of z proximate the quantum well.

Some embodiments are directed to a method of making a light emitting device. According to the method, an n-side heterostructure is grown on a polar or semi-polar face of a substrate. An active region that includes one or more quantum wells disposed between barriers is grown on the n-side heterostructure. The active region is configured to emit light during operation of the light emitting device. A p-side heterostructure is grown with an electron blocking layer (EBL) comprising an aluminum containing group III-nitride alloy grown between the active region and the p-side heterostructure.

In some configurations, the EBL is grown on a surface identified by crystallographic indices (hk($\overline{h+k}$)m) with m>0 and the aluminum composition in the EBL decreases as a function of distance along a direction, $V_n$, normal to the (hk($\overline{h+k}$)m) surface over a majority of the thickness of the EBL.

In some configurations, the EBL is grown on a surface identified by crystallographic indices (hk($\overline{h+k}$)m) with m<0 and the aluminum composition in the EBL increases as a function of distance along a direction, Vn, normal to the (hk($\overline{h+k}$)m) surface over a majority of the thickness of the EBL.

DESCRIPTION

Figure 1:
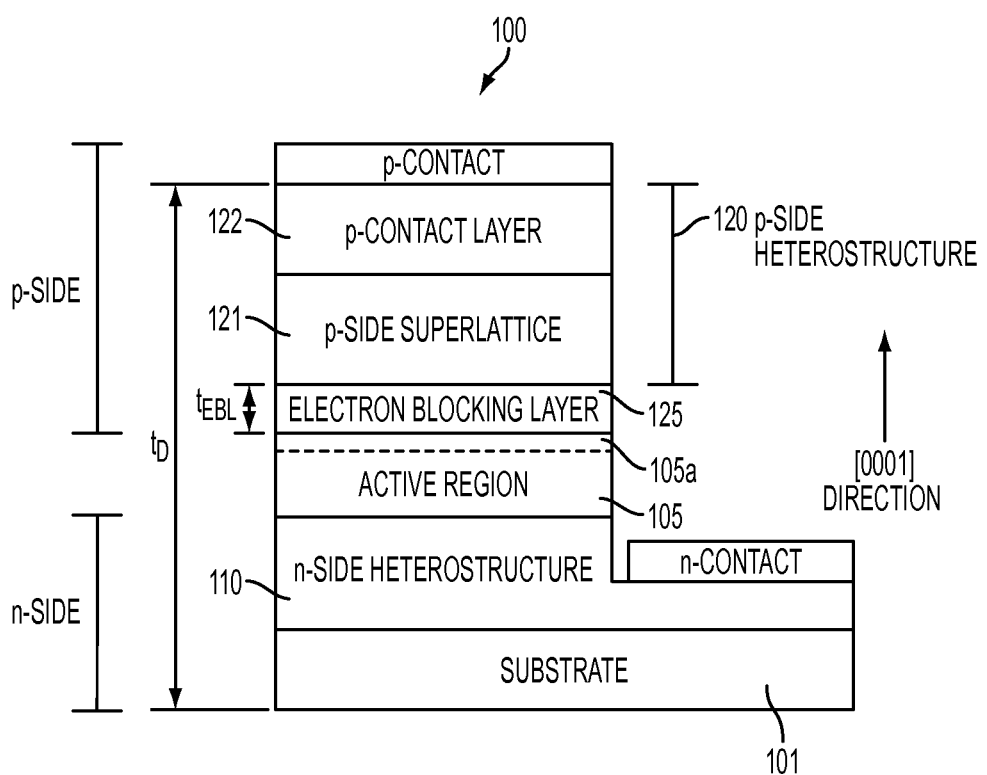
FIG. 1 is a block diagram of a light emitting device that may include a graded last barrier and/or a graded electron blocking layer (EBL) according to various embodiments.

Light emitting diodes and laser diodes can be produced based on larger bandgap semiconductor materials, such as III-nitride materials including AlN, AlGaN, InGaN, InAl-GaN, and others. However, doping these materials to achieve high hole concentration is difficult because the activation energy of dopants in these larger bandgap materials is relatively high. Approaches described in this disclosure relate to polarization enhanced doping to increase the hole concentration in one or more layers of light emitting devices formed using polarized crystals, such as the III-nitride family. Although discussed in terms of the III-nitrides, those skilled in the art will understand that the techniques presented herein are applicable to polarization enhanced doping for light emitting devices formed using a variety of polarized semiconductors.

Polarization is an intrinsic property of some crystals, and is related to the distribution of positive charge of the atomic nuclei and the negative charge of the electrons in the crystal. Polarization can be employed to increase or decrease the local concentration of mobile carriers present in semiconductors. This is called polarization enhance doping and can be employed to improve the performance of devices.

Polarization is present in compounds exhibiting the wurtzite structure and comprising atoms having large differences in electronegativity. Examples of such materials include AlN, GaN, InN, and alloys of these materials (AlGaN, InAlN, AlGaInN). Polarization is also present in oxides such as ZnO and BeO. The polarization of an alloy depends on the composition of the alloy. The amount of polarization also depends on the amount of strain present in the material. The polarization that arises from strain is called the piezoelectric polarization, and the polarization that is present even in the absence of strain is called the spontaneous polarization. Strain affects the polarization because it affects the distribution of charge. A very thick freestanding film of AlN will exhibit no strain, and in such a state will exhibit spontaneous polarization only.

A layer of material A will be strained when it is grown on a thick substrate material S if the equilibrium lattice constant of A (in the plane of the interface with S) differs from that of S. In the absence of strain relieving defects the in-plane lattice constant of A is forced to be the same as that of S. In this case we say that A is pseudomorphic to S. For example, if a thin layer of AlGaN is grown on a thick substrate of AlN then the AlGaN will exhibit compressive strain, and the AlGaN layer will exhibit both spontaneous and piezoelectric polarization. The AlN substrate is not strained and will exhibit only the spontaneous polarization of bulk AlN. If a thin layer of AlGaN is grown on a thick substrate of GaN then the AlGaN will exhibit tensile strain. Thus the polarization in AlGaN will depend on whether it is grown on AlN or GaN.

Polarization gives rise to fixed charges at the interface formed between two layers of material with different polarization. Because the polarization charges are fixed, they do not themselves contribute to electrical transport in the crystal, however, the polarization charges can affect the concentration of mobile carriers. The polarization charges are present when the polarization field within the crystal is changing with distance. For example, the discontinuity in the polarization that arises at an interface between two materials having different polarization gives rise to a sheet charge density that is proportional to the change in the polarization across the interface.

When fixed charges are present at the interface, the fixed charges are neutralized by mobile charges in the material. The amount of mobile charge that the polarization charges induce at the interface of two nitride layers is dependent on the composition and structure of the crystal. In the case of AlGaN, for example, the aluminum composition of the AlGaN at the junction determines the amount of polarization and thus the amount of mobile charges induced at the interface. Note that polarization enhanced doping may be applied to carriers of either type. In nitride based light emitting devices, polarization enhanced doping is particularly relevant to enhancing hole concentration due to the difficulty of doping the nitride layers to achieve high p-type donor concentrations and simultaneously providing high conductivity layers.

FIG. 1 depicts a cross sectional view of a light emitting device 100 that may incorporate various optional layers that rely on polarization enhanced doping achieved by a varying Al composition. In the example shown in FIG. 1, the light emitting device 100 includes an active region 105, an electron blocking layer (EBL) 125, wherein the active region 105 and EBL are disposed between an n-side heterostructure 110 and an p-side heterostructure 120 that includes a p-side superlattice 121 and p-contact layer 122. The device layers can be epitaxially grown on a polarized or semi-polarized substrate 101, e.g., an AlN, Si, sapphire, SiC, or III-N substrate, starting with the n-side heterostructure 110 and progressing to the p-contact layer 122 with a total device thickness, $t_D$. In various embodiments, light produced by the device 100 may be in a range of about 200 nm to about 700 nm, e.g., about 200 to about 365 nm; about 365 nm to about 550 nm; or about 550 nm to about 700 nm.

The active region may include one or multiple quantum wells that are separated by barriers. The last barrier 105a of the active region proximate to the EBL is depicted in FIG. 1. In light emitting devices, electrons from the n-side of the device and holes from the p side of the device diffuse to the active region where they may recombine to generate light. Light emitting devices may use an electron blocking layer (EBL) 125 disposed between the active region 105 and the p-side heterostructure 120 to help contain electrons within the active region 105. Because light emission depends on recombination of holes and electrons in the active region 105, it is beneficial to retain electrons in the active region and also to increase hole injection into the active region from the p-side of the device to increase the likelihood of recombination.

In some embodiments, hole concentration in the electron blocking layer (EBL) 125 can be increased by varying the Al concentration of the EBL. Polarization created by a decreasing Al composition in the EBL as a function of distance can increase the hole concentration in the EBL. At least some of these additional holes are injected into the active region and increase the injection efficiency of the device. EBLs that have a varying Al composition are referred to herein as "graded EBLs." Note that the Al composition in the EBL may in general have any profile and need not be a linear or ramped profile so long as the Al composition is varying. The Al composition profile may be linear or non-linear, may be stepped, and/or may be monotonic or non-monotonic.

The active region 105 may include quantum wells interspersed with barrier layers, the quantum wells and/or barriers may be formed using any nitride based material system, such as InGaN, AlGaN, InAlN, InAlGaN, or other nitrides. The EBL may be a III-nitride material including InGaN, AlGaN, InAlN, InAlGaN or other aluminum containing group III nitrides. In some cases, the EBL can predominantly comprise AlGaN along with a small amount of In. Indium may be used as a surfactant to facilitate growth of the device and a small amount of In may incorporate in the predominantly AlGaN EBL during fabrication.

The device may alternatively comprise other material systems, e.g., ZnO, or other material systems having a wurtzite crystalline structure and exhibiting sufficiently large polarization fields to cause a significant increase in carrier concentration. The EBL can be doped with p-type donor atoms. For EBLs comprising III-nitride materials, a preferred dopant is Mg and a suitable doping level is a concentration of Mg atoms of about $10^{19}$/cm3 to $5\times10^{20}$/cm3. In some cases, the graded EBL 125 may comprise $Al_yGa_{1-y}N$ wherein y decreases from a first, higher Al composition value proximate to the active region 105 towards a second, lower Al composition value proximate to the p-side heterostructure 120 along the growth direction, e.g., the [0001] direction, of the device.

Referring to FIG. 1, in some cases, EBL comprises an aluminum containing group-III-nitride alloy wherein the Al composition of the graded EBL may decrease across a majority of the thickness of the EBL along the [0001] direction. The graded EBL can be grown on the group-III face of a III-nitride material, for example. The graded EBL described herein can be grown in a polar orientation on a (0001) surface in the [0001] direction or on a (000$\bar{1}$) surface in the [000$\bar{1}$] direction. The graded EBL described herein can alternatively be grown in a semi-polar orientation where the [0001] direction of the material forms an angle θ with respect to the surface normal vector. In semi polar orientations, however, the change in polarization at the interfaces is reduced.

Figure 2:
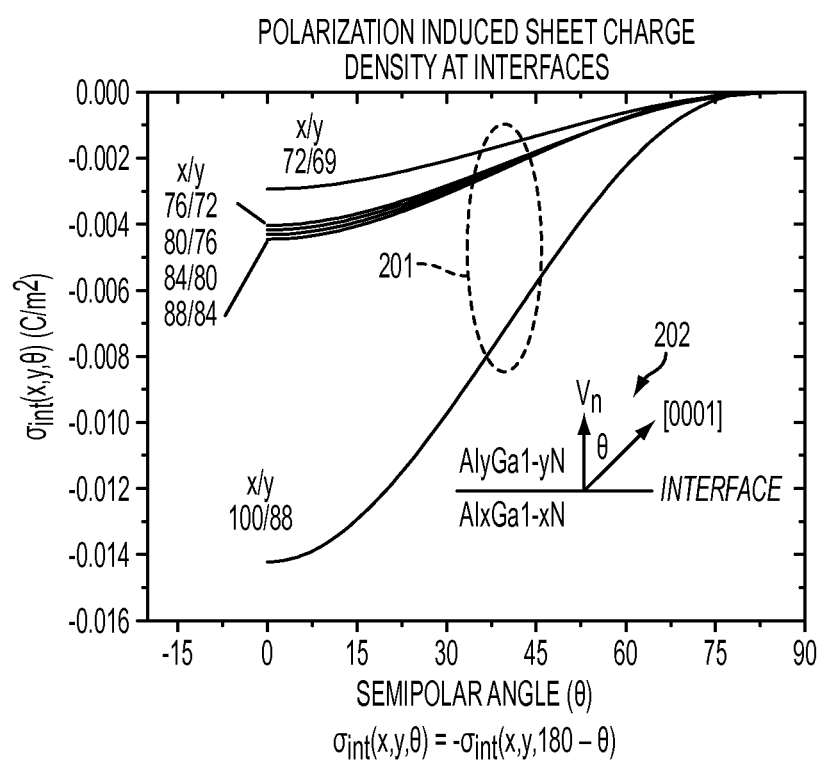
FIG. 2 provides the polarization induced sheet charge density at interfaces as a function of semi polar angle for several interface Al compositions.

FIG. 2 plots a family of curves 201 corresponding to the polarization induced sheet charge density $\sigma_{int}(x,y,\theta)$ in Coulombs/m$^2$ (C/m$^2$) at interfaces at which various changes in Al composition occur with respect to θ, where θ is the angle between the vector normal to the device surface, $V_n$, and the [0001] direction, as illustrated in the inset diagram 202. In the family of plots 201, x and y are the Al compositions of the materials at the interface, with $Al_xGa_{1-x}N$ disposed at one side of the interface and $Al_yGa_{1-y}N$ disposed at another side of the interface. Note that $\sigma_{int}(x,y,\theta)=-\sigma_{int}(x,y,180-\theta)$.

The vector normal to the surface, $V_n$, is the growth direction. In the case where θ=0, a polar orientation, the growth direction is the [0001] direction. In general, devices grown on surfaces identified by crystallographic (Miller) indices (hk($\bar{h+k}$)m) with m greater than zero should have graded EBLs with decreasing Al composition along the direction $V_n$ normal to the (hk-(h+k)m) surface. In these cases, the lattice vector c of the wurtzite structure material makes an angle θ with $V_n$ that is between 0 and 90 degrees. This general configuration includes devices grown on the (0001) surface where c and $V_n$ are parallel.

Devices grown on surfaces identified by crystallographic (Miller) indices (hk($\bar{h+k}$)m) with m less than zero should have graded EBLs with increasing Al composition along the direction $V_n$ normal to the (hk-(h+k)m) surface. In these cases, the lattice vector c of the wurtzite structure material makes an angle θ with $V_n$ that is between 90 and 180 degrees. This general configuration includes devices grown on the (000-1) surface where c and $V_n$ are anti-parallel.

The family of plots shown in FIG. 2 include six possible interface compositions for the EBL, x=1, y=0.88; x=0.88, y=0.84; x=0.8, y=0.76; x=0.76, y=0.72. It will be appreciated from observation of the family of plots 201 that the polarization induced when charge density $\sigma_{int}$ decreases in magnitude as θ increases from 0 to 90 degrees. θ=0 corresponds to the polar configuration. 0<θ<90 and 90<θ<180 correspond to semi polar configurations. Thus, it is possible to employ graded EBLs in devices grown on semipolar surfaces, but the interface charges in semipolar configurations are not expected to be as large as for in polar configurations. Thus the efficacy of employing a graded EBL in a device grown on a semipolar surface may be somewhat less than for a fully polar surface.

Figure 3:
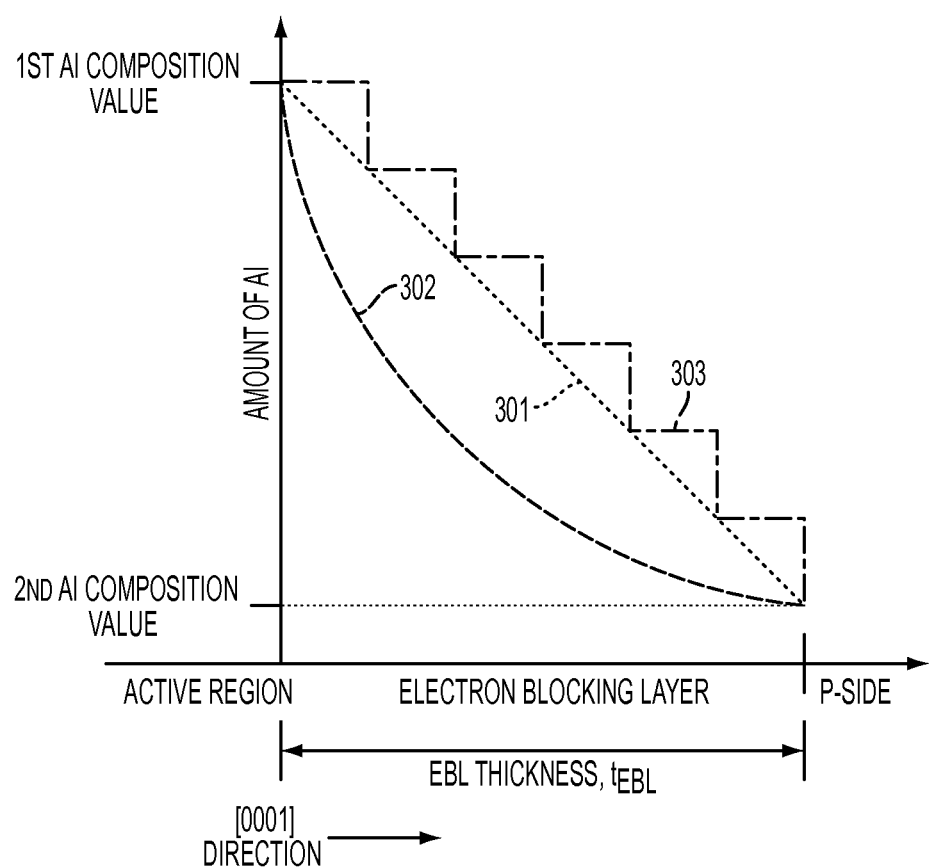
FIG. 3 depicts various exemplary Al composition profiles that may be used in a graded EBL.

FIG. 3 shows exemplary Al composition profiles that may be used for a graded EBL comprising $Al_yGa_{1-y}N$. Possible profiles include, but are not limited to, a monotonically decreasing linear profile 301, a non-linear profile 302, and a stepped profile 303. The decrease in Al composition in the graded EBL can occur over a majority of the thickness, $t_{EBL}$, of the EBL 125, i.e., 50% or more of $t_{EBL}$, or at least about 85% $t_{EBL}$, or over substantially all of $t_{EBL}$, where $t_{EBL}$ may range from about 7.5 nm to about 30 nm.

In some cases, the graded EBL may comprise $Al_yGa_{1-y}N$ having an Al composition profile corresponding to y proximate the active region in a range of about 0.8 to about 1 and y proximate the p-side superlattice in a range of 0.7 to 0.5. In some cases, the graded EBL comprises $In_{1-y}Al_yN$ having an Al composition profile corresponding to y proximate the active region of about 0.93 and y proximate the p-side heterostructure of about 0.81. The reason for the smaller change in the Al composition for InAlN when compared to AlGaN is that the band gap of InAlN changes more quickly with Al composition than does AlGaN. In general, the graded EBL may have an Al composition proximate the active region corresponding to y in a range of about 0.8 to about 1 and an Al composition proximate the p-side heterostructure corresponding to y in a range of about 0.85 to about 0.5. The value of y may decrease by about 0.35 over a majority of the EBL. The final value of y proximate the p-side heterostructure may be in the range of the Al composition at the superlattice composition. The rate of change of the Al composition in the graded EBL may be greater than or equal to about 30% in 10 nm, for example.

Figure 4:
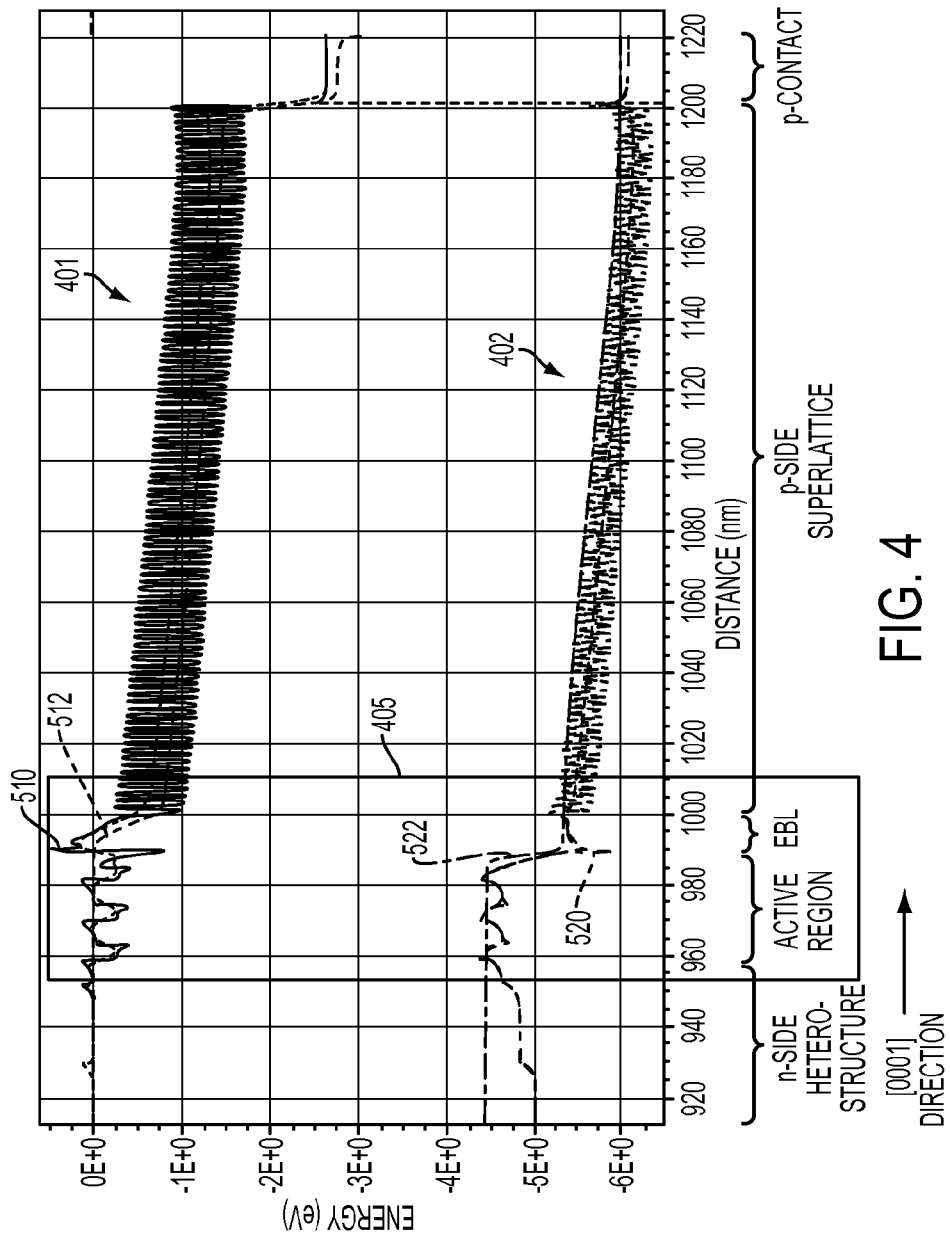
FIG. 4 shows the conduction band and valence band potentials in a portion of a light emitting device that includes a graded EBL according to embodiments described herein.

The variation in the Al composition in the graded EBL affects the energy band structure within the EBL. FIG. 4 shows the conduction band 401 and valence band 402 as a function of distance in a portion of the light emitting device. Energy values in this energy band diagram (and other energy band diagrams included herein) are shown in eV along the y axis, with distance referenced from d=0 proximate to the n-contact layer and extending in the positive direction to the right along the x axis which corresponds to the [0001] direction. FIG. 4 shows the conduction 401 and valence 402 potential energies as a function of distance for the n-side heterostructure, the active region, EBL, p-side superlattice, and p-contact layer.

Figure 5:
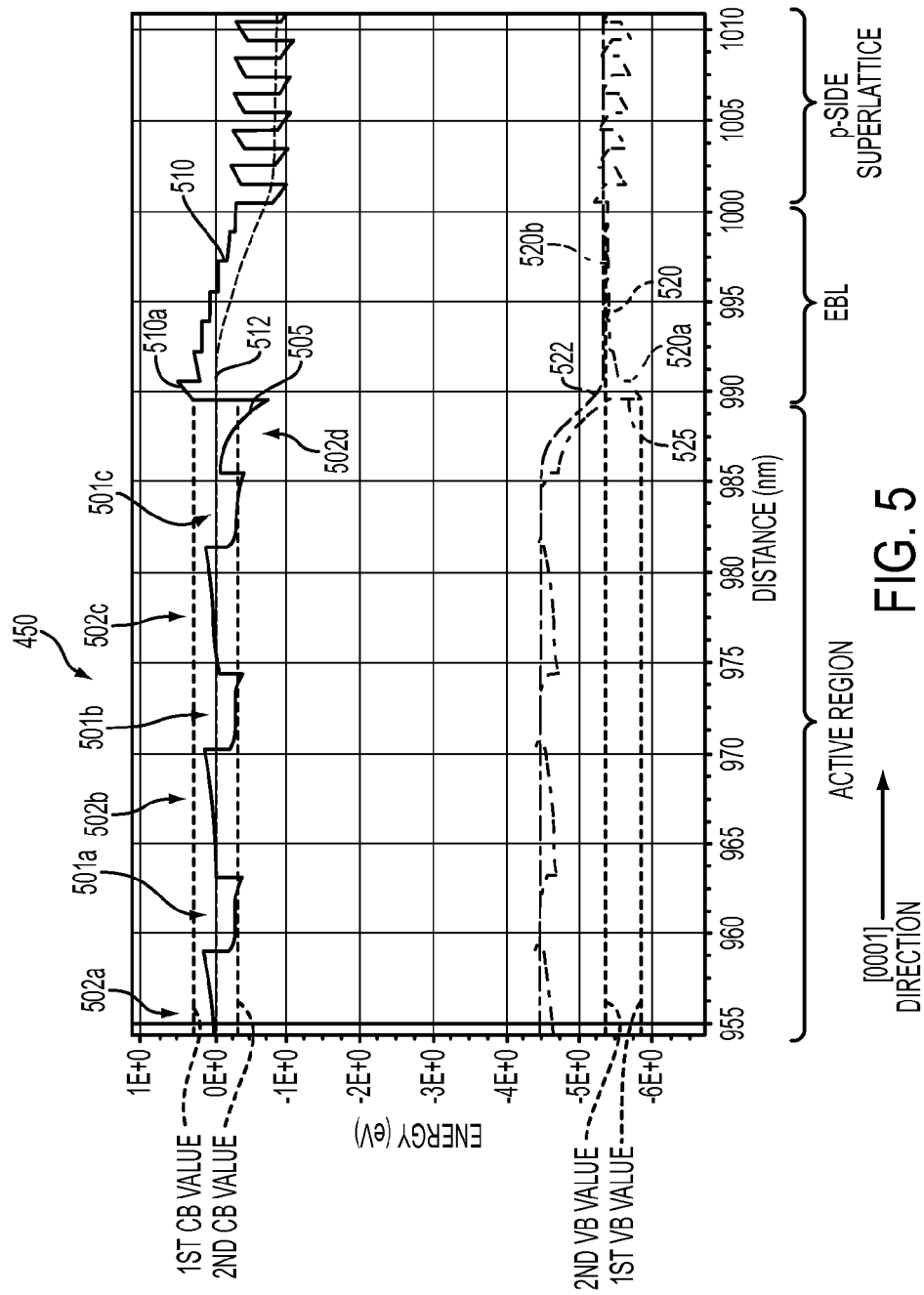
FIG. 5 is an expanded view of a portion of the band diagrams of FIG. 4.

FIG. 5 is an expanded view of the energy bands present in the portion of the light emitting device indicated by rectangle 450 in FIG. 4. FIG. 5 shows fluctuations in the energy bands at the first, second, and third quantum wells at conduction band regions 501a-c and fluctuations of the energy bands in the barriers at conduction band regions 502a-d. The EBL is positioned after the last barrier 502d and/or between the active region and the p-side superlattice. In this example, the EBL comprises $Al_yGa_{1-y}N$ where y steps down across the thickness of the EBL from y=1 proximate to the active region to y=0.69 proximate to the p-side superlattice. The EBL used as an example in FIGS. 4 and 5 includes y=1 for a 1 nm step proximate the active region, followed by six 1.65 nm steps having Al compositions corresponding to y=0.88, 0.84, 0.80, 0.76, 0.72, and 0.69, respectively. In some embodiments, the highest Al composition in the EBL is greater than the Al composition in the last barrier of the active region and/or more than 30% greater than the average Al composition in the p-side heterostructure.

The decrease in the Al composition along the [0001] direction over a majority of the thickness of the EBL provides increased hole concentration in the EBL, increased hole injection into the active region, and reduced flow of electrons past the active region into the p-side heterostructure. The step-wise decrease in the Al composition occurs over a majority of the thickness of the EBL and causes a corresponding step-wise decrease in the conduction band energy in the EBL.

The conduction band energy decreases from a first conduction band energy value at a first point proximate to the active region to a second conduction band energy value at a second point proximate to the p-side heterostructure. Note that in FIGS. 4 and 5, trace 510 represents the conduction band, trace 520 represents the valence band, trace 512 is the conduction band quasi-Fermi level, and trace 522 is the valence band quasi-Fermi level.

In this case, difference between the first conduction band energy value ($1^{st}$ CB energy≈0.25 eV) and the second conduction band energy value ($2^{nd}$ CB energy≈−0.3) is about 0.55 eV. In general, using a graded EBL as discussed herein, a decrease between the first conduction band energy value and the second conduction band energy value may have a range of about 0.5 eV to about 1.0 eV where the decrease occurs over a majority, e.g., more than 50% or even more than 86% of the thickness of the EBL. In some cases the first conduction band energy value may be 0.4 eV greater than the conduction band energy value in the quantum wells. The higher value of the first conduction band energy in comparison to the conduction band energies the active region is necessary to inhibit flow of electron current past the active region into the p-side heterostructure.

The valence band energy increases from a first valence band energy value ($1^{st}$ VB energy≈−5.87 eV) proximate to the active region to a second valence band energy value ($2^{nd}$ VB energy≈−5.4 eV) and then remains substantially constant until reaching the p-side heterostructure. Thus, the increase in the valence band energy occurs over a minority of the EBL thickness, e.g., less than 25% of the thickness of the EBL. In the illustrated example, the difference between the first valence band energy and the second valence band energy is about 0.37 eV. In general, using a graded EBL as discussed herein, a difference between the first valence band energy value and the second valence band energy value may have a range of about 0.2 eV to about 0.5 eV, wherein the increase occurs over less than 25% of the EBL thickness.

The higher potential of the conduction band at portion 510a of the conduction band proximate the active region serves to block the escape of at least some electrons injected from the n-side of the device. Electrons that remain longer in the active region have greater likelihood of combining with holes to create light. Additionally, the step-wise ramped Al composition profile of the EBL provides polarization enhanced hole concentrations in the EBL. As a result of grading the Al composition, the valence band potential 520 seen by the holes is predominantly flat at the portion 520b across a majority (greater than 50%) of the valence band proximate the p-side superlattice, and includes only a narrow variation in potential in the portion 520a across a minority (less than 25%) of the valence band proximate the active region. Holes in the valence band can achieve energy to overcome this narrow barrier or tunnel through the barrier to reach the active region. As is apparent from FIGS. 4 and 5, the valence band quasi-Fermi level 422 is very close to the valence band edge 420 over a majority of the thickness of the EBL, resulting in a higher concentration of holes in the EBL. Thus, the varying Al composition in the EBL provides a relatively high potential barrier seen by electrons over a relatively wide portion (greater than 50% or even greater than 85%) of the EBL which serves to block the electrons from exiting the active region. Additionally or alternatively, the graded Al composition also serves to enhance hole concentration in the EBL and hole injection into the active region due to the narrow potential barrier seen by holes, the relatively flat valence band potential, and the proximity of the valence band edge to the quasi-Fermi level over a substantial portion of the EBL.

Figure 6:
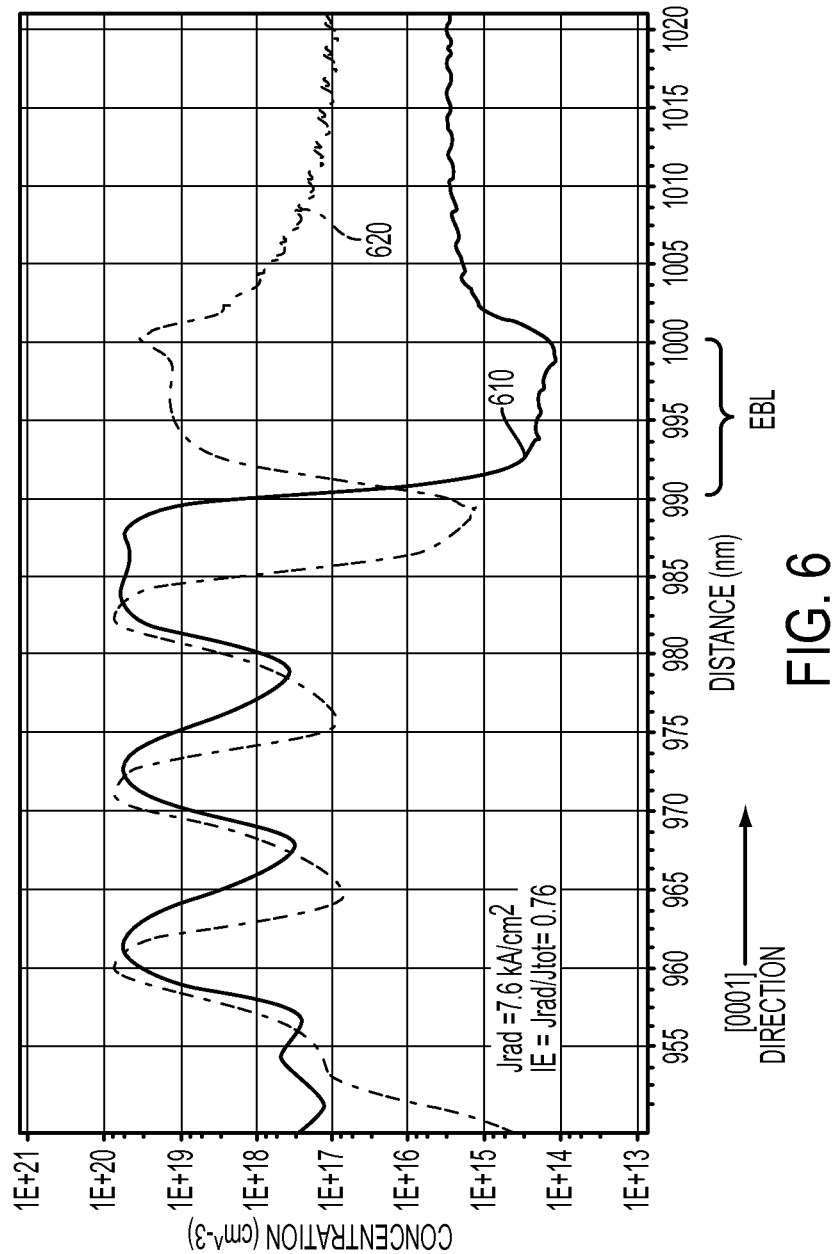
FIG. 6 shows the concentration of mobile carriers (electrons and holes) in portions of a light emitting device that has a graded EBL.

FIG. 6 shows the electron 610 and hole 620 carrier concentrations of the device of FIGS. 4 and 5 as a function of distance in a device that includes an EBL with decreasing Al composition in the [0001] direction. The injection efficiency of a device is the ratio of the recombination current, $J_{rad}$ to J t the current injected into the device, $J_{tot}$. The graded EBL device having a decreasing Al composition in the [0001] direction has an injection efficiency IE=0.76 for a value of $J_{rad}$=7.6 kA/cm².

As can be appreciated from the plots shown in FIG. 6, the electron concentration 610 within the graded EBL and in the p-side heterostructure layer is suppressed. Consequently, the conductivity in these regions arises predominantly from the holes.

Figure 7:
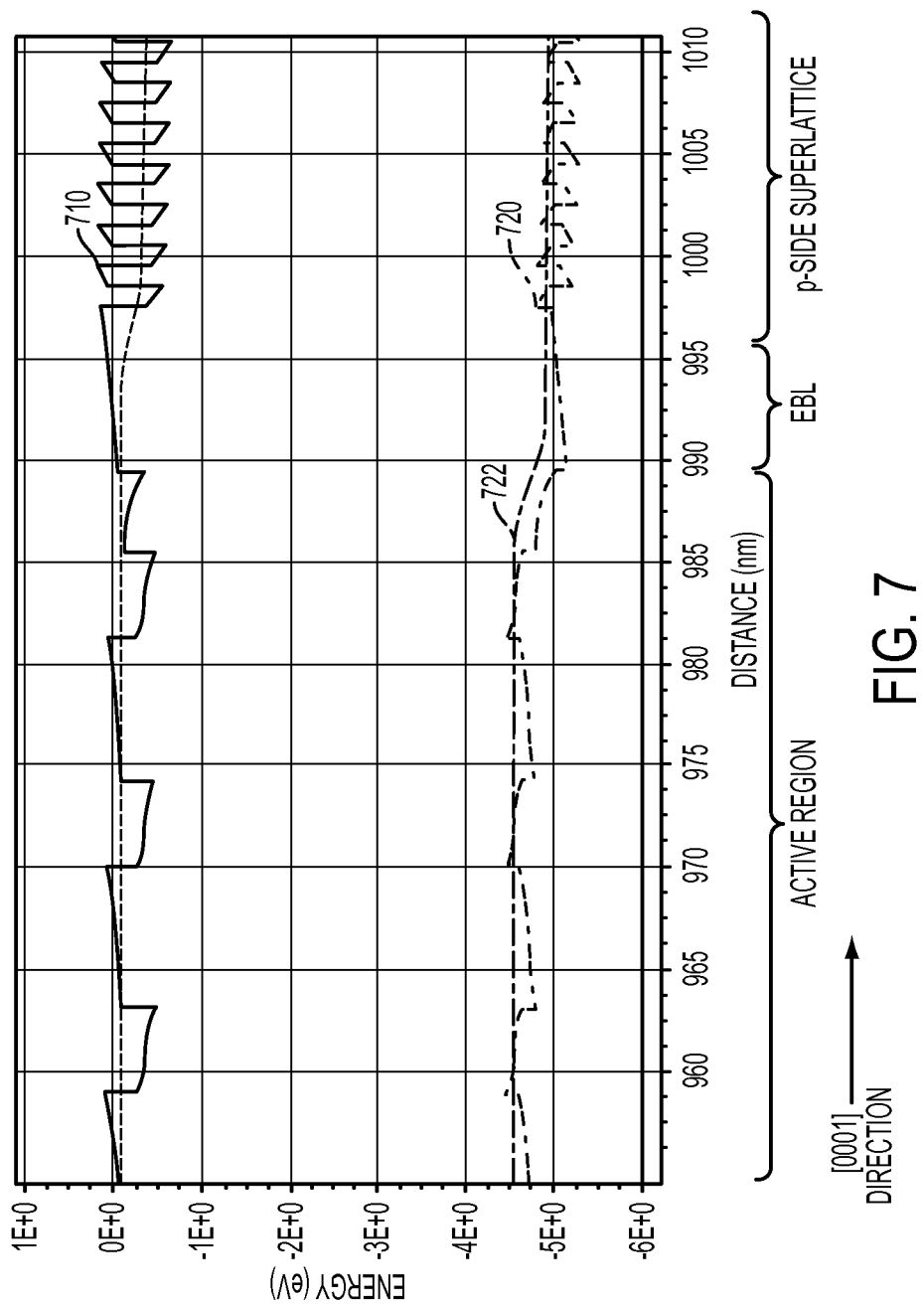
FIG. 7 shows an expanded view of the conduction and valence bands for a light emitting device that includes an EBL having a uniform Al composition.
Figure 8:
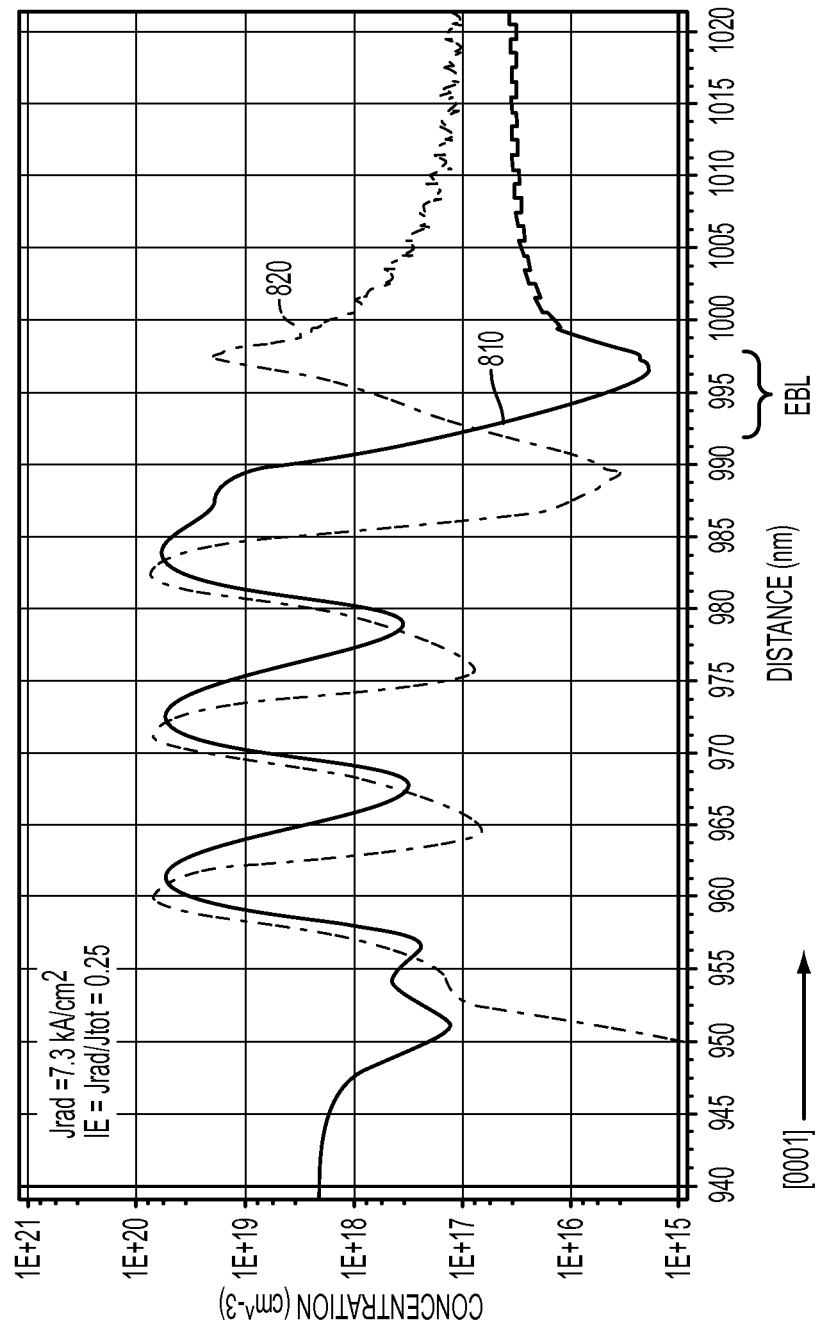
FIG. 8 shows the concentration of mobile carriers (electrons and holes) in portions of a light emitting device that has a uniform EBL.

FIGS. 7 and 8 illustrate the conduction and valence energies 710, 720 and the electron and hole concentrations 810, 820, respectively, for a device that includes an EBL having an Al composition that is substantially non-varying or uniform across the thickness of the EBL.

It will be appreciated from comparison of FIGS. 5 and 7 that the potential barrier of the conduction band produced by the non-varying Al composition EBL (referred to herein as a "non-graded EBL") presents a lower blocking potential for electrons in the conduction band when compared to the blocking potential barrier produced by the graded EBL. The valence band energy barrier seen by holes in the graded EBL (FIG. 5) is greater in some regions than the valence band potential barrier seen by holes in the non-graded EBL (FIG. 7). However, as previously discussed, the valence band barrier presented to holes by the graded EBL is very narrow, allowing holes to tunnel through the barrier, and the quasi-Fermi level 422 in the graded EBL is also much closer to the valence band edge 420 when compared with the quasi-Fermi level 622 in the non-graded EBL, resulting in greater mobile hole concentration in the graded EBL.

FIG. 8 shows the electron 810 and hole 820 carrier concentrations of the device of FIG. 7 as a function of distance in a device that includes a non-graded EBL. The recombination current, Jrad=7.3 kA/cm² and injection efficiency IE=0.25 for this device. Comparison of efficiencies for grade and non-graded EBLs shows that the graded EBL provides a much higher IE.

Figure 9:
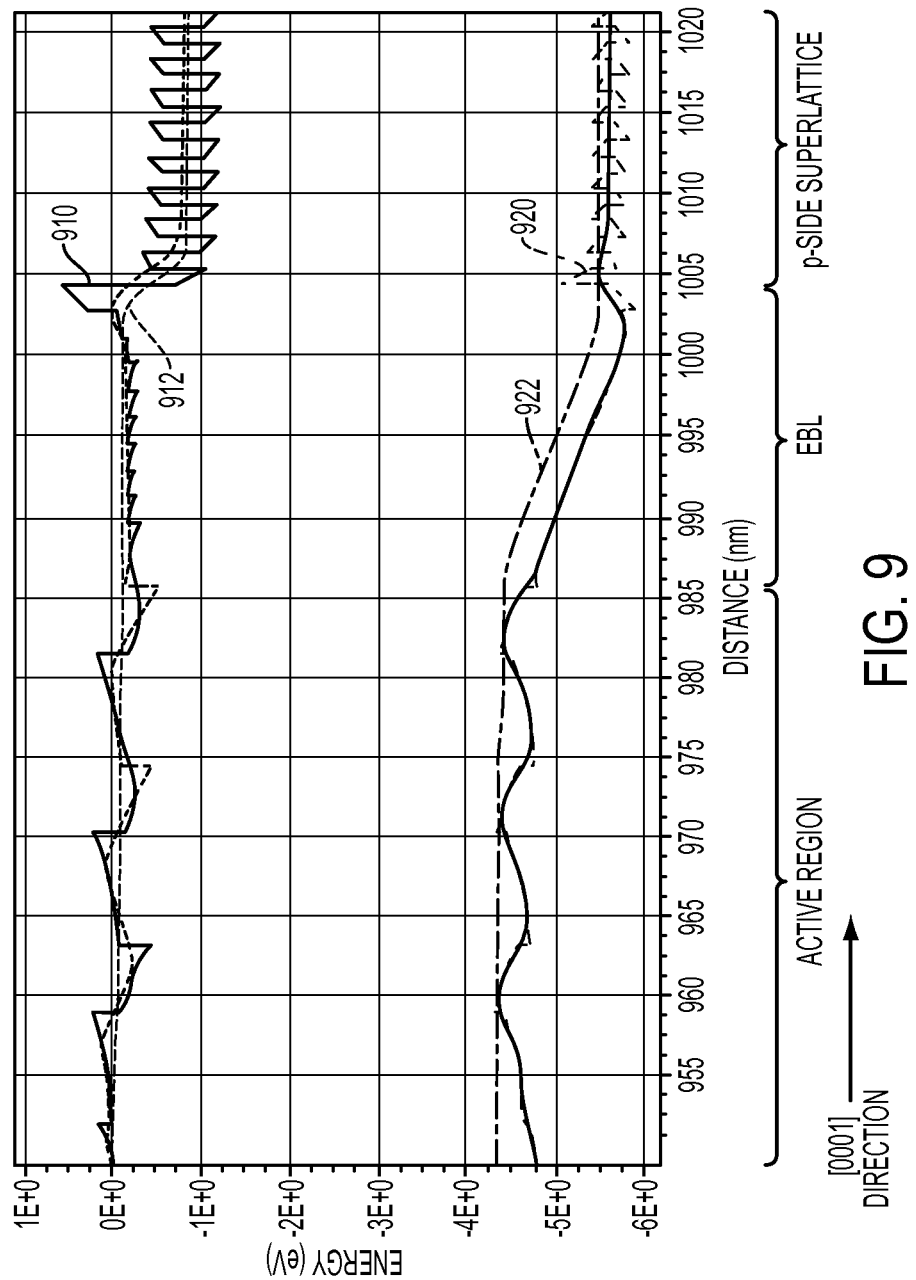
FIG. 9 shows an expanded view of the conduction and valence bands for a light emitting device that includes an EBL having Al composition that grades from a lower Al composition value at the active region to a higher Al composition value at the p-side heterostructure.
Figure 10:
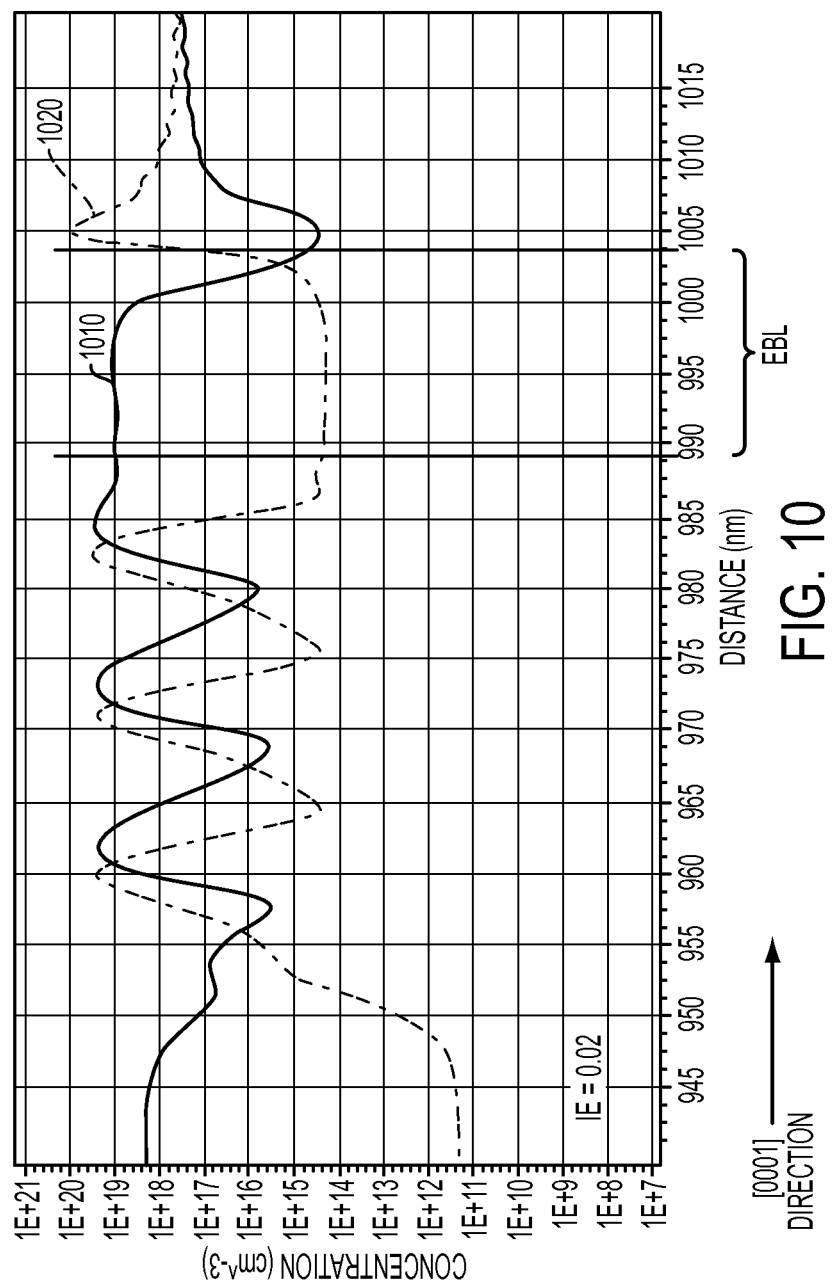
FIG. 10 shows the concentration of mobile carriers (electrons and holes) in portions of a light emitting device of FIG. 9.

The direction of the Al composition grading is also a factor. FIGS. 9 and 10 illustrate the conduction and valence energies 910, 920 and the electron and hole concentrations 1010, 1020, respectively, for a device that includes an EBL having an Al composition that oppositely graded from the device shown in FIGS. 5 and 6. The device shown in FIGS. 9 and 10 (referred to herein as an "oppositely graded EBL") comprises $Al_yGa_{1-y}N$ wherein the Al composition increases in the [0001] direction from the active layer towards the p-side heterostructure in 9 1.65 nm steps, where y=0.60, 0.64, 0.68, 0.72, 0.76, 0.80, 0.84, 0.88, and 1, respectively.

Depending on the direction of the grading of the Al composition, a different polarization charge is created at each of the interfaces in the graded section as the composition of Al is changed. Decreasing the Al composition along the [0001] direction from the active region towards the p-side, as in the graded EBL examples discussed herein, results in a sign of charge that is different from the sign of charge that results from increasing Al composition along the [0001] from the active region towards the p-side. The graded EBL comprises a decreasing the Al composition in the [0001] direction from the active region towards the p-side which produces a high hole concentration and a relatively low electron concentration. In comparison, an oppositely graded EBL, as described in connection with FIGS. 9 and 10, has an increasing Al composition in the [0001] direction from the active region to the p-side. As will be appreciated from the electron and hole concentration plots of FIG. 10, grading the Al composition along the [0001] direction from a lower value at the active region to a higher value at the p-side heterostructure creates high electron concentration. The relatively high electron concentration observed in the oppositely graded EBL can be contrasted with the more suppressed electron concentration of the graded EBL evident from the electron and hole concentration plots of FIG. 6. So, the oppositely graded EBL is a relatively poor electron blocker—the injection efficiency of the device having an oppositely graded EBL described in conjunction with FIGS. 9 and 10 is fairly low (IE=0.02), which is significantly lower than the IE of the graded EBL (IE=0.76) as discussed in conjunction with of FIGS. 5 and 6.

At higher current densities, in the device having a non-graded EBL (or oppositely graded EBL), a large number of electrons are being injected into the device. However, the potential barrier presented to the injected electrons by the non-graded or oppositely graded EBL is insufficient, thus many of the injected electrons overshoot the active region and are not available for recombination in the active region to produce light. In contrast, for graded EBLs at the higher current densities, the electrons are blocked by the higher potential conduction band barrier of the graded EBL, and thus are retained in the active region to recombine with holes, enhancing the efficiency of the device.

Figure 11:
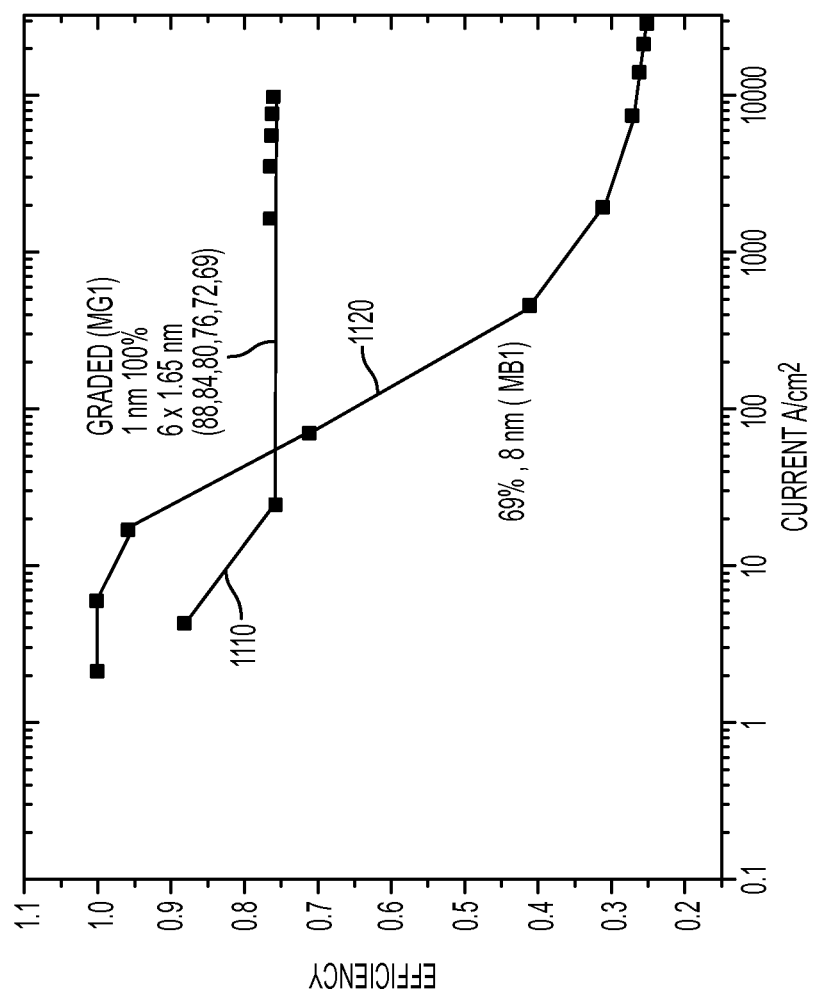
FIG. 11 is a graph that includes superimposed traces of the efficiency of light emitting devices having graded and constant Al composition EBLs as a function of current density.

FIG. 11 is a graph that includes superimposed traces of the injection efficiency (IE) of light emitting devices having the graded (FIG. 5) and non-graded (FIG. 7) EBLs as a function of current density. In FIG. 11, trace 1110 corresponds to the efficiency of an $Al_yGa_{1-y}N$ EBL having a graded Al composition according to a stepped Al composition profile with y=1 proximate the active region and decreasing to y=0.69 at the opposite edge of the EBL proximate the p-side superlattice. In this example, the Al composition at the edge of the graded EBL nearest the active region corresponds to y=1 in a 1 nm step. The Al composition decreases from the initial value of y=1 in six 1.65 nm steps of decreasing Al composition, the six steps having y=0.88, 0.84, 0.80, 0.76, 0.72, and 0.69, respectively. Trace 1120 corresponds to the IE of a non-graded Al composition EBL having an Al composition corresponding to y=0.69 across the thickness of the EBL. As indicated by FIG. 11, at higher current density values, e.g., current densities in excess of about 55 A/cm², the graded EBL provides higher efficiency when compared to an EBL having a constant Al composition.

In some cases, a graded EBL may be used in conjunction with a last barrier of the active region that has a spatially varying Al composition. The Al composition in the last barrier may change in a series of steps or change continuously. The last barrier of the active region is the barrier of the active region that is closest to the EBL. Referring back to FIG. 5, the conduction band in the last barrier is shown, as indicated by arrow 502d. In this example, the last barrier is not graded, e.g., has a relatively uniform Al composition. The conduction band in non-graded last barrier 502d exhibits a pocket 405 where electrons can accumulate and possibly recombine with holes without contributing to the optical mode at the lasing wavelength. The pocket 505 forms due to the large polarization charge at the interface between the last barrier and the EBL. By increasing the Al composition in a portion of the last barrier it is possible to reduce the depth of the conduction band in the last barrier so that electron accumulation in the last barrier pocket 505 is mitigated.

A graded last barrier may comprise $Al_zGa_{1-z}N$, where z increases in the [0001] direction from first value of z proximate the last quantum well to a second value of z proximate to the EBL. The graded last barrier can be used in conjunction with a graded EBL to reduce the loss of electrons and holes due to recombination in the last barrier. For example, in polar configurations, the Al composition in the graded last barrier can increase step-wise in the [0001] direction from the last quantum well in the active region towards the EBL, where the z increases from a first value proximate the last quantum well to a second value proximate the graded EBL across at least a portion of the thickness of the last barrier. As previously mentioned, semi polar configurations may be implemented. When a graded EBL is used in conjunction with the graded last barrier, the graded EBL decreases from a first composition of aluminum to a second composition of aluminum along the growth direction of the device from the last barrier towards the p-side heterostructure. The graded last barrier may exhibit any Al composition profile, so long as the Al composition is generally increasing from the last quantum well towards the EBL along the growth direction. The thickness of the last barrier may be in a range from about 4 nm to about 20 nm. In one configuration, the graded last barrier has a thickness of about 7 nm and an Al composition that increases in three steps—a first step 2 nm in width having z=0.54, a second step 3 nm in width having z=0.7 and a third step 3 nm in width having z=0.8.

In some embodiments, a portion of the last barrier is doped, e.g., with a p-type dopant such as Mg. It is desirable to keep dopants out of the quantum wells, and if dopants are incorporated in the last barrier during growth then these dopants might diffuse into the quantum wells. To prevent dopants from diffusing to the quantum wells, in some embodiments, only some (but not all) or none of the barriers are doped with a p-type dopant, including the last barrier. However, in some cases it can be helpful to dope at least a portion of the last barrier with a p-type dopant to improve hole injection into the quantum wells. The doped portion of the last barrier, if present, would be that portion furthest from the quantum wells.

Systems, devices or methods disclosed herein may include one or more of the features, structures, methods, or combinations thereof described herein. For example, a device or method may be implemented to include one or more of the features and/or processes described herein. It is intended that such device or method need not include all of the features and/or processes described herein, but may be implemented to include selected features and/or processes that provide useful structures and/or functionality.

In the following detailed description, numeric values and ranges are provided for various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various implementations. These materials are to be treated as exemplary, and are not intended to limit the scope of the claims.

The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

The invention claimed is:

1. A light emitting device, comprising:
   a p-side heterostructure;
   an n-side heterostructure;
   an active region disposed between the p-side heterostructure and the n-side heterostructure and configured to emit light;
   an electron blocking layer (EBL) disposed on a growth surface and arranged between the p-side heterostructure and the active region, the EBL having a thickness and comprising an aluminum containing group-III-nitride alloy; and
   a p-side superlattice disposed on the electron blocking layer,
   wherein an aluminum composition of the EBL changes as a function of distance along a growth direction-from the active region towards the p-side heterostructure over a majority of the thickness of the EBL, and wherein the change in the aluminum composition is dependent on growth surface orientation, wherein the aluminum composition in the EBL decreases along the growth direction for a growth surface orientation having crystallographic indices (hk($\overline{h+k}$)m) with m greater than zero or the aluminum composition in the EBL increases along the growth direction for a growth surface orientation having crystallographic indices (hk($\overline{h+k}$)m) with m less than zero.

2. The device of claim 1, wherein the aluminum containing group-III-nitride alloy comprises InAlN.

3. The device of claim 1, wherein the aluminum containing group-III-nitride alloy comprises AlGaN.

4. The device of claim 1, wherein the EBL is configured so that a conduction band energy of the EBL decreases as a function of distance along a direction from the active region towards the p-side heterostructure over a majority of the thickness of the EBL.

5. The device of claim 1, wherein the EBL is configured so that a polarization within the EBL increases as a function of distance along a direction from the active region towards the p-side heterostructure over a majority of the thickness of the EBL.

6. The device of claim 1, wherein the active region is configured to emit light in a wavelength range of about 200 nm to about 365 nm.

7. The device of claim 1, wherein the active region is configured to emit light in a wavelength range of about 365 nm to about 550 nm.

8. The device of claim 1, wherein the active region is configured to emit light in a wavelength range greater than about 550 nm to about 700 nm.

9. A light emitting device, comprising:
   a p-side heterostructure;
   an n-side heterostructure;
   an active region disposed between the p-side heterostructure and the n-side heterostructure and configured to emit light; and
   an electron blocking layer (EBL) disposed between the p-side heterostructure and the active region and having a thickness, the EBL comprising $Al_yGa_{1-y}N$, wherein y is graded in a number of discrete steps, a width of the steps changing as a function of distance along a growth direction from the active region towards the p-side heterostructure over a majority of the thickness of the EBL, wherein an aluminum composition of the EBL changes as a function of distance along the growth direction-from the active region towards the p-side heterostructure over a majority of the thickness of the EBL, wherein the change in the aluminum composition is dependent on growth surface orientation, wherein the aluminum composition in the EBL decreases along the growth direction for a growth surface orientation having crystallographic indices (hk($\overline{h+k}$)m) with m greater than zero or the aluminum composition in the EBL increases along the growth direction for a growth surface orientation having crystallographic indices (hk($\overline{h+k}$)m) with m less than zero.

10. The device of claim 9, further comprising an AlN substrate wherein the n-side heterostructure is grown on the (0001) surface of the AlN substrate.

11. The device of claim 9, wherein a difference between a first value y in the EBL proximate the active region and a second value of y in the EBL proximate the p-side heterostructure is about 0.35.

12. The device of claim 9, wherein a first value of y in the EBL proximate the active region is in a range of about 0.8 to about 1 and a second value of y in the EBL proximate the p-side heterostructure is in a range of about 0.5 to 0.7.

13. The device of claim 9, wherein y decreases with distance at a rate of about 30% in 10 nm.

14. The device of claim 9, wherein a first value of y in the EBL proximate the active region is in a range of about 0.1 to about 0.3 and a second value of y in the EBL proximate the p-side heterostructure is in a range of about 0 to 0.1, and wherein the active region is configured to emit light in a wavelength range between about 365 nm and 550 nm.

15. The device of claim 9, wherein the EBL is configured so that a conduction band energy of the EBL decreases as a function of distance along a direction from the active region towards the p-side heterostructure, the conduction band energy decreasing from a first conduction band value to a second conduction band value over a majority of the thickness of the EBL.

16. The device of claim 15, wherein the EBL is configured so that:
   an electron quasi Fermi level in the EBL is more than about 0.25 eV from the conduction band energy over a majority of the thickness of the EBL; and
   a hole quasi Fermi level in the EBL is less than about 0.1 eV from the valence band energy over a majority of the thickness of the EBL.

17. A light emitting device, comprising:
   a p-side heterostructure;
   an n-side heterostructure;
   an active region disposed between the p-side heterostructure and the n-side heterostructure and configured to emit light, the active region comprising a III-nitride material; and
   an electron blocking layer (EBL) disposed on a growth surface and arranged between the p-side heterostructure and the active region, the EBL having a thickness and comprising an aluminum containing group III-nitride alloy, wherein a change in an aluminum composition of the EBL is dependent on orientation of a growth surface, and
      wherein the growth surface orientation is a semi-polar growth surface orientation identified by crystallographic indices (hk($\overline{h+k}$)m) with m>0 and the aluminum composition in the EBL decreases as a function of distance along a growth direction normal to the growth surface over a majority of a thickness of the EBL, or
      the growth surface orientation is a semi-polar growth surface orientation identified by crystallographic indices (hk($\overline{h+k}$)m) with m<0 and the aluminum composition increases as a function of distance along the growth direction normal to the growth surface over a majority of a thickness of the EBL.

18. The device of claim 17, wherein m<0 and the aluminum composition in the EBL increases at a rate of about 30% in 10 nm.

19. The device of claim 17, wherein the EBL comprises $Al_yGa_{1-y}N$ or $In_{1-y}Al_yN$, and y in the EBL proximate the active region is about 0.8 to about 1 and y in the EBL proximate the p-side heterostructure is about 0.5 to about 0.85.

20. The device of claim 17, wherein m>0 and the aluminum composition decreases at a rate of about 30% in 10 nm.

21. A light emitting device, comprising:
    a p-side heterostructure;
    an n-side heterostructure;
    an active region disposed between the p-side heterostructure and the n-side heterostructure and configured to emit light, the active region comprising a number of quantum wells separated by barriers, the barriers including a last barrier comprising $Al_zGa_{1-z}N$, only a portion of the last barrier being doped with a p-type dopant; and
    an electron blocking layer (EBL) disposed on a growth surface and arranged between the p-side heterostructure and the last barrier, the EBL comprising $Al_yGa_{1-y}N$, wherein y changes as a function of distance from the last barrier and the change in y is dependent on orientation of the growth surface, wherein y decreases as a function of distance along a growth direction over a majority of a thickness of the EBL for a growth surface orientation identified by crystallographic indices $(hk(\overline{h+k})m)$ with m>0 or y increases as a function of distance along the growth direction over a majority of the thickness of the EBL for a growth surface orientation identified by crystallographic indices $(hk(\overline{h+k})m)$ with m<0, and
    wherein a value of z proximate the EBL is greater than the value of z proximate the quantum well.

22. The device of claim 21, wherein the EBL is configured so that a conduction band energy of the EBL decreases as a function of distance along a direction from the active region towards the p-side heterostructure, the conduction band energy decreasing from a first conduction band value to a second conduction band value over a majority of the thickness of the EBL.

23. The device of claim 22, wherein the EBL is configured so that:
    an electron quasi Fermi level in the EBL is more than about 0.25 eV from the conduction band energy over a majority of the thickness of the EBL; and
    a hole quasi Fermi level in the EBL is less than about 0.1 eV from the valence band energy over a majority of the thickness of the EBL.

24. The device of claim 21, wherein a difference between a first value of z in the last barrier proximate a last quantum well and a second value of z in the last barrier proximate the EBL is about 0.25.

25. The device of claim 21, wherein a first value of z in the last barrier proximate a last quantum well is about 0.54 and a second value of z in the last barrier proximate the EBL is about 0.8.

26. The device of claim 21, wherein a thickness of the last barrier is between about 4 nm to about 20 nm.

27. The device of claim 21, wherein z increases in a series of steps over a thickness of the last barrier, each step having a step thickness in a range of about 1 to about 3 nm.

28. A method of making a light emitting device, comprising:
    growing an n-side heterostructure on a polar or semipolar face of a substrate;
    growing an active region comprising one or more quantum wells disposed between barriers, the active region configured to emit light during operation of the light emitting device;
    growing a p-side heterostructure; and
    growing an electron blocking layer on the active region, wherein the electron blocking layer (EBL) is grown on a growth surface and is disposed between the p-side heterostructure and the active region, the EBL having a thickness and comprising an aluminum containing group III-nitride alloy, wherein:
    growing the EBL comprises grading an aluminum composition of the EBL dependent on orientation of the growth surface such that the growth surface orientation has crystallographic indices $(hk(\overline{h+k})m)$ with m>0 and the aluminum composition in the EBL decreases as a function of distance over a majority of the thickness of the EBL along a growth direction normal to the growth surface or the growth surface orientation has crystallographic indices $(hk(h+k)m)$ with m<0 and the aluminum composition in the EBL increases as a function of distance over a majority of the thickness of the EBL along the growth direction normal to the growth surface.

29. The method of claim 28, wherein
    growing the active region comprises growing a last barrier between a last quantum well and the EBL and a first aluminum composition in the last barrier proximate the EBL is greater than a second aluminum composition in the last barrier proximate the last quantum well; and
    only a portion of the last barrier is doped with a p-type dopant, the portion being farthest from the last quantum well.

\* \* \* \* \*